(12) United States Patent
Wimpenny

(10) Patent No.: US 9,385,662 B2
(45) Date of Patent: Jul. 5, 2016

(54) SUPPLY MODULATOR

(71) Applicant: SNAPTRACK, INC., San Diego, CA (US)

(72) Inventor: Gerard Wimpenny, Cambridge (GB)

(73) Assignee: SNAPTRACK, INC., San Diego, CA (US)

( * ) Notice: Subject to any disclaimer, the term of this patent is extended or adjusted under 35 U.S.C. 154(b) by 36 days.

(21) Appl. No.: 14/466,173

(22) Filed: Aug. 22, 2014

(65) Prior Publication Data

US 2015/0054588 A1 Feb. 26, 2015

(30) Foreign Application Priority Data

Aug. 23, 2013 (GB) .................................. 1315121.2

(51) Int. Cl.
*H03G 3/20* (2006.01)
*H03F 1/02* (2006.01)
*H03F 3/19* (2006.01)
*H03F 3/21* (2006.01)
*H03F 3/217* (2006.01)

(52) U.S. Cl.
CPC ............ *H03F 1/0222* (2013.01); *H03F 1/0227* (2013.01); *H03F 1/0277* (2013.01); *H03F 3/19* (2013.01); *H03F 3/21* (2013.01); *H03F 3/217* (2013.01); *H03F 2200/102* (2013.01); *H03F 2200/339* (2013.01); *H03F 2200/432* (2013.01); *H03F 2200/451* (2013.01)

(58) Field of Classification Search
CPC .............................. H03F 1/0222; H03F 1/0227
USPC .......................................... 330/127, 136, 297
See application file for complete search history.

(56) References Cited

U.S. PATENT DOCUMENTS

| 8,643,435 B2* | 2/2014 | Lim ...................... H03F 1/0227 330/127 |
| 2014/0160962 A1* | 6/2014 | Lehtinen ............... H04W 52/22 370/252 |

FOREIGN PATENT DOCUMENTS

EP 2582040 A2 4/2013

OTHER PUBLICATIONS

Parent Patent Application: GB 1315121.2, Search Report, Feb. 25, 2014, Publisher: UK IPO, Published in: GB.

* cited by examiner

*Primary Examiner* — Steven J Mottola

(57) ABSTRACT

There is disclosed an envelope tracking supply modulator comprising a switch mode path and a linear amplifier path, wherein the linear amplifier path includes a plurality of amplifiers, each amplifier having an output stage of a different size, wherein at least one of the plurality of amplifiers is enabled in dependence on an output power.

18 Claims, 7 Drawing Sheets

SUPPLY MODULATOR

CROSS-REFERENCE TO RELATED APPLICATION

Great Britain Patent Application No. 1315121.2, with a filing date of Aug. 23, 2013, is incorporated herein by reference.

FIELD OF THE INVENTION

The present invention relates to power supply modulators, and in particular a power supply modulator including a switch mode path and a linear path. The invention concerns improvements in the linear path, including an error amplifier. The invention is particularly but not exclusively concerned with the provision of a modulated power supply in a cellular telephone handset.

BACKGROUND TO THE INVENTION

Modulated power supplies as a part of envelope modulators in an enveloped tracked power supply system are well-known. FIG. 1 shows an envelope tracked power amplifier (PA) system in which the power amplifier supply voltage is modulated synchronously with the instantaneous power amplifier input power.

With reference to FIG. 1 there is illustrated a power amplifier system 40 which receives an input signal on line 30 and generates an output signal on line 32. The input signal on line 30 is provided to a IQ modulator 10, which provides an output to an optional delay adjustment block 12 in an RF input path and to an envelope detect block 18 in an envelope path.

In the RF input path the delay adjust block 12 is provided to allow for delays in the envelope path. It should be noted that in general a delay could also or alternatively be provided in the envelope path. The purpose of any delay is to align the signals in the envelope and RF paths at the power amplifier. The output of the delay adjust block 12 is connected to an upconvert block 14 which converts the input signal to an RF signal. The output of the upconvert block 14 on line 34 provides an input to the power amplifier 16, and the output of the power amplifier 16 is provided on line 32.

The envelope detect block 18 in the envelope path provides a signal which represents the envelope of the input signal to a non-linear mapping block 20, which in turn provides an output to an envelope modulator 22. The envelope modulator comprises a low-frequency path including a switcher 24 and a high-frequency path including a linear amplifier 26. The switcher 24 and the linear amplifier 26 each receive the output of the non-linear mapping block 20. The output of the switcher 24 and the output of the linear amplifier 26 are combined by a combiner 28, and the output of the combiner 28 provides a supply voltage on line 36 to the power amplifier 16.

As illustrated in FIG. 1 the envelope modulator comprises a switcher 24. The switcher 24 may comprise one or more switch mode DC-DC converters, which provide the bulk of the direct current (DC) and low-frequency (LF) output power. As also illustrated in FIG. 1 the envelope modulator comprises a linear amplifier 26. The linear amplifier 26 provides the residual high-frequency (HF) output power.

The arrangement of FIG. 1 allows the envelope modulator 22 to simultaneously achieve high efficiency and high tracking accuracy. The power amplifier supply voltage on line 36 is dynamically adjusted to be just sufficient for the power amplifier to generate the required instantaneous output power, markedly improving its efficiency.

An example use of an envelope tracked power amplifier system such as that shown in FIG. 1 is in a cellular telephone handset. Cellular telephone handsets use complex modulation with high peak-to-average power ratio. The transmit signal is typically divided into timeslots, and the average transmit power for each timeslot is set to the required level by a controller. To maximise battery life, it is important to minimise the power consumption of the power amplifier subsystem (i.e. the subsystem shown in FIG. 1) across a wide range of output powers.

A typical cellular telephone handset uses a combination of supply modulation techniques to achieve this. For example, at low output powers the power amplifier is typically powered by an average power tracking (APT) converter which provides a DC voltage which is adjusted from slot-to-slot. An APT converter may be provided by using one or more of the switchers of the envelope tracking modulator described above, by disabling the linear amplifier. At high output powers the power amplifier may instead be powered from the complete envelope tracking modulator such as that shown in FIG. 1.

The efficiency of an exemplary power amplifier including the supply converter (APT or ET) is illustrated in FIG. 2. FIG. 2 illustrates a plot of the average power amplifier efficiency (including the envelope tracking or average power tracking supply) against the average RF output power. The waveform 50 illustrates the plot for an average power tracking supply converter, and the waveform 52 illustrates the plot for an envelope tracking power converter.

As can be seen in FIG. 2, the vertical dash line 54 is indicative of a point on the average output power (of the RF output) axis at which the overall power efficiency is the same in both the envelope tracking and average power tracking modes of operation. This point at which the overall power amplifier efficiency is the same for both modes can be considered to be a "crossover" point, being the point at which the mode having the higher efficiency changes. As can be seen in FIG. 2 for average RF output powers below the dash line 54 the APT mode has a higher average power amplifier efficiency, and for average RF output power above the dash line 54 the envelope tracking mode has the higher average power amplifier efficiency.

It is an aim of the present invention to improve the efficiency of the envelope tracking solution when operating below maximum output power, thereby reducing the ET/APT efficiency crossover point.

SUMMARY OF THE INVENTION

In accordance with the invention there is provided a modulator of an envelope tracking power amplifier system in which the linear amplifier is adapted to include a plurality of error amplifiers, the plurality of error amplifiers being of different sizes.

There is provided an envelope tracking supply modulator comprising a switch mode path and a linear amplifier path, wherein the linear amplifier path includes a plurality of amplifiers, each amplifier having an output stage of a different size, wherein at least one of the plurality of linear amplifiers is enabled in dependence on an output power.

The at least one of the plurality of amplifiers may be enabled in dependence on the required output power. The required output power may be the average power measured across a transmission slot.

Preferably one of the plurality of linear amplifiers is enabled, and the other linear amplifiers are disabled. At least one of the plurality of linear amplifiers may be enabled in dependence on a peak output power.

The output power may be determined for a transmission slot.

The outputs of the plurality of linear amplifiers may be combined with an output of the switch mode path to provide a modulated supply voltage.

There may be provided a power amplifier, the modulated supply voltage being the supply voltage for the power amplifier. The power amplifier may include a plurality of power amplifiers, each connected to receive the modulated supply voltage. The power amplifier may comprise multiple power amplifiers having different sizes, each power amplifier may be associated with one of the plurality of linear amplifiers. At least one of the plurality of power amplifiers may be selectively enabled. The at least one of the plurality of power amplifiers which is enabled may be determined by the at least one of the plurality of linear amplifiers which is enabled.

Each power amplifier connected to receive the modulated supply voltage may be paired with a linear amplifier of the ET modulator, such that a pair is enabled in dependence on the output power.

There may be provided one or more summers to sum one or more of the outputs of the linear amplifier with the switch mode output to provide one or more modulated supply voltages. There may be provided one or more power amplifiers connected to receive the one or more modulated voltages as a respective power supply. The power amplifier may comprise multiple power amplifiers having different sizes, each power amplifier being associated with one of the plurality of the linear amplifiers.

The linear amplifier may be arranged for correcting an error in the switch mode path, each of the plurality of amplifiers being an error amplifier.

There is further provided a method of providing an envelope tracking modulated supply comprising providing a switch mode path and providing a linear amplifier path, the method further comprising providing a plurality of linear amplifiers in the linear amplifier path, and sizing the output stage of each of the plurality of linear amplifiers to have a different size, and enabling at least one of the plurality of amplifiers in dependence on an output power.

The at least one of the plurality of amplifiers may be enabled in dependence on the required output power. The average power may be measured across a transmission slot. Enabling at least one of the plurality of amplifiers may be in dependence on an average or peak output power. The method may further comprise determining the output power for a transmission slot.

The method may further comprise combining the outputs of the plurality of amplifiers with an output of the switch mode path to provide a modulated supply voltage. The method may further comprise providing the modulated supply voltage as a supply voltage of an amplifier. The method may further comprise providing the modulated supply voltage to a plurality of amplifiers having different sizes. The method may further comprise selectively enabling ones of the plurality of amplifiers. The one or more of the plurality of amplifiers may be selectively enabled in dependence on the one or more of the amplifiers of the linear amplifier which are enabled.

Each power amplifier may be connected to receive the modulated supply voltage and is paired with a linear amplifier of the envelope path, such that a pair is enabled in dependence on the output power.

BRIEF DESCRIPTION OF THE FIGURES

The invention is now described with reference to the accompanying Figures, in which.

DETAILED DESCRIPTION

The invention is now described with reference to particular examples and embodiments. In particular the invention is described with reference to an implementation of a cellular telephone handset including a hybrid modulator which can provide an envelope tracking power supply and an average power tracking power supply. However the invention is not limited to such a specific example, and one skilled in the art will appreciate that such example is described herein for the purposes of illustration.

The invention is concerned with an arrangement in which an envelope tracking power supply is provided, with an apparatus including an envelope modulator. One of the principle contributors to the power consumption of an envelope modulator when operating below maximum output power is the quiescent power of the linear amplifier. The linear amplifier is provided in the high-frequency path, and may also be considered the error amplifier of the envelope modulator. Most of this quiescent power is dissipated in the output stage of the linear amplifier. The output stage of the linear amplifier typically operates in class AB mode to achieve acceptable high-power efficiency, and its bias current is typically set by crossover distortion considerations. Various techniques may be provided for setting the bias current of the output stage of the linear amplifier. However if the bias current is set too low, then severe crossover distortion may result.

Figure 3:
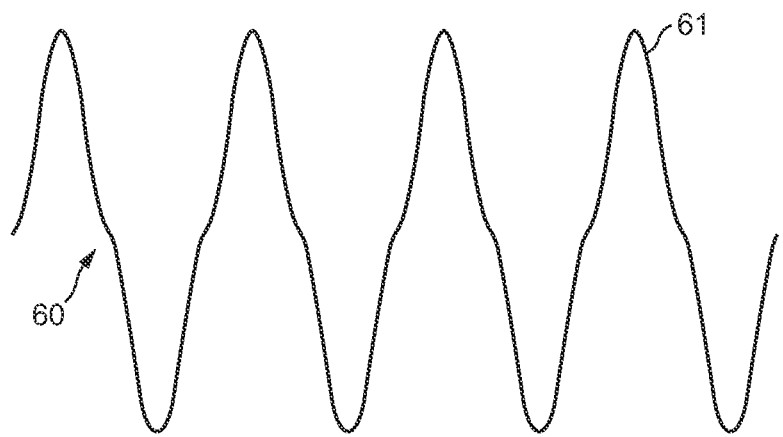
FIG. 3 illustrates crossover distortion in an exemplary error amplifier of an envelope modulator.

Reference can be made to FIG. 3 in which there is illustrated an exemplary waveform 61 provided by the output stage of the linear amplifier, which as denoted by reference numeral 60 includes crossover distortion.

Crossover distortion becomes proportionally worse at low output powers, and hence it is not possible to save power by simply reducing the quiescent current when operating at lower output powers.

Although different techniques for determining the bias current are known, the bias current required for an error amplifier output stage will always be directly proportional to the size of the output stage devices, which in turn is determined by the peak current the error amplifier must supply when operating at maximum output power.

It would be possible to reduce the quiescent power consumption by disabling a proportion of the output devices of the linear amplifier when operating at low output power. However, for a high-speed amplifier this typically significantly alters the compensation of the amplifier, adversely affecting its frequency response and stability. It is thus not a desirable solution.

A practical solution is to connect multiple different sized error amplifiers (the size of an error amplifier being approximately proportional to the chip area) in parallel and to select on a slot-by-slot basis the smallest error amplifier capable of providing the required output power. The compensation of each amplifier is optimised according to its size. In this context size is used to mean the peak output current capability of the amplifier. The power level of the next slot may be communicated to the envelope modulator via an appropriate controller interface, and used to select the error amplifier size for the next slot. Individual error amplifiers or combinations of error amplifiers may be selected.

Figure 4:
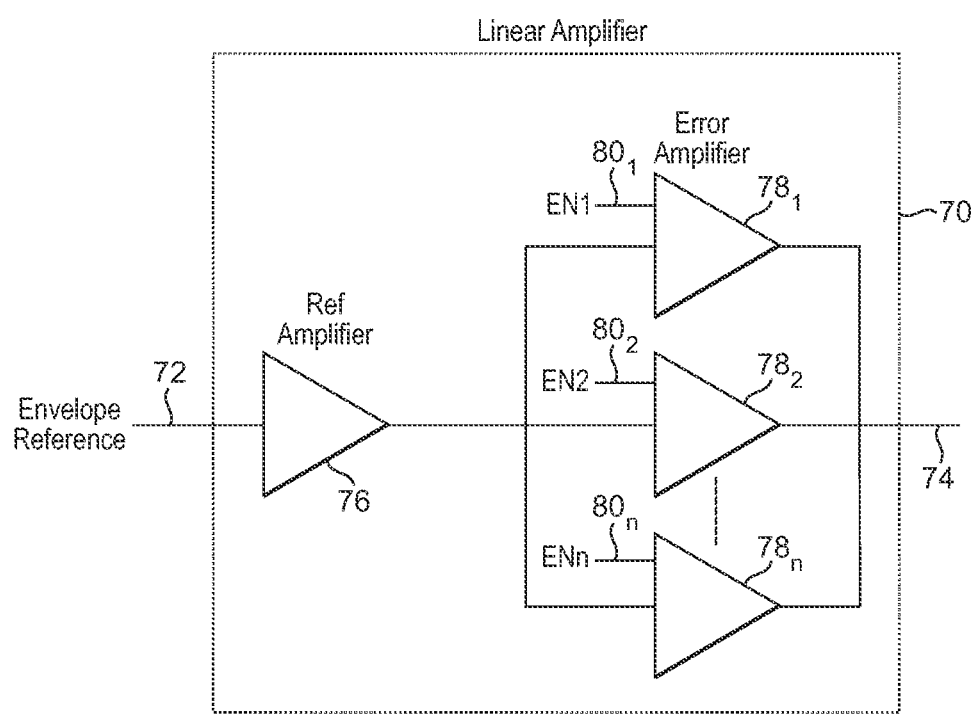
FIG. 4 illustrates an exemplary implementation of an error amplifier in accordance with an improvement.

This is illustrated schematically in FIG. 4.

In FIG. 4 there is illustrated a linear amplifier denoted by reference numeral 70, which receives an input signal on line 72 and generates an output signal on line 74. The input signal on line 72 is an envelope reference signal. The envelope reference signal on line 72 is provided to a reference amplifier 76, and the output of the reference amplifier 76 provides an input to one of a plurality n of error amplifiers, which are represented in FIG. 4 by three error amplifiers $78_1$, $78_2$, and $78_n$.

Each error amplifier $78_1$, $78_2$, $78_n$ additionally receives an enable signal denoted by reference numeral $80_1$, $80_2$, $80_n$. The enable signals are provided by an appropriate control interface, such that only one of the error amplifiers is preferably enabled at any time. The outputs of each error amplifier are connected to the output line 74 of the linear amplifier.

Although in a preferred arrangement only one of a plurality of amplifiers is enabled, more than one of the plurality may be enabled at any one time.

Each of the error amplifiers $78_1$, $78_2$, $78_n$ has compensation optimised for the size of its own output stage, and as the error amplifiers are parallel at low impedance points then the response of the active amplifier (i.e. the amplifier 16 in FIG. 1) is affected very little by the presence of the error amplifiers which are disabled.

This approach has little impact on the overall silicon area utilised, as the area of the parallel connected error amplifiers is dominated by the size of the output stage of the largest error amplifier.

Figure 1:
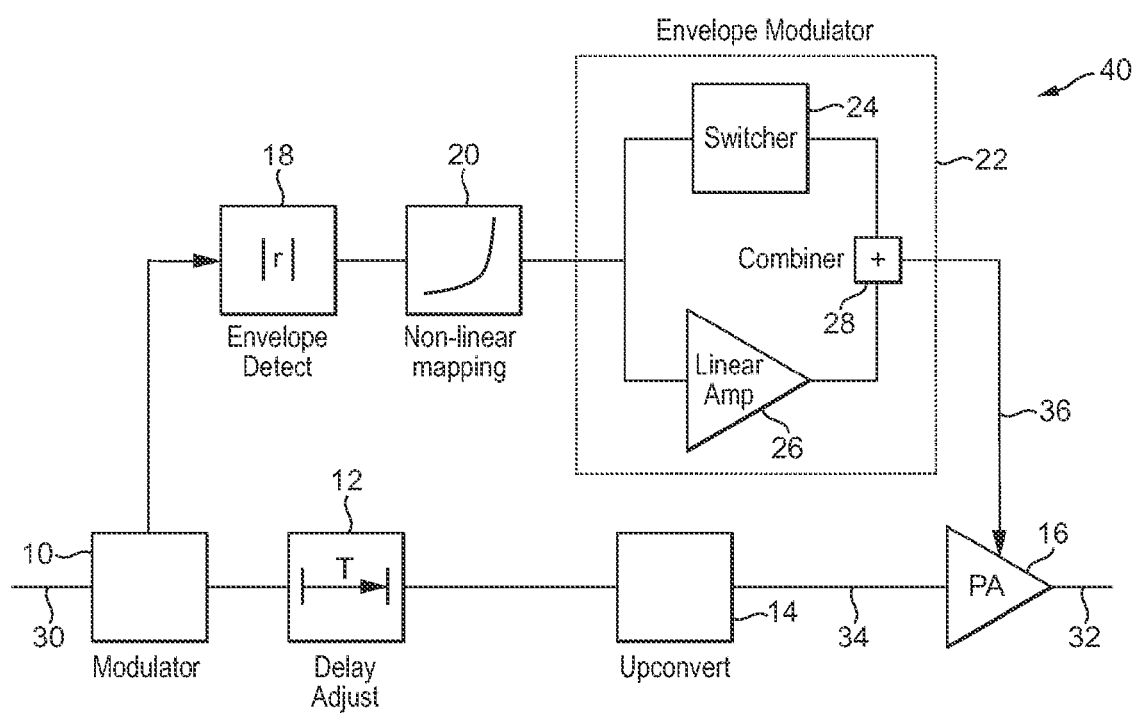
FIG. 1 illustrates an exemplary envelope tracked power amplifier system.

With respect to FIG. 4, the envelope reference signal on line 72 may be provided by the output of the non-linear mapping block 20 of FIG. 1. The envelope reference signal on line 72 is thus the envelope signal in the envelope path. The reference amplifier 76 merely provides an amplification of the signal for the linear amplifiers. The output of the linear amplifier on line 74 may correspond to the output of the linear amplifier 26 of FIG. 1, and provide an input to a combiner block, such as combiner block 28 of FIG. 1, for combining with the low frequency path.

Figure 5:
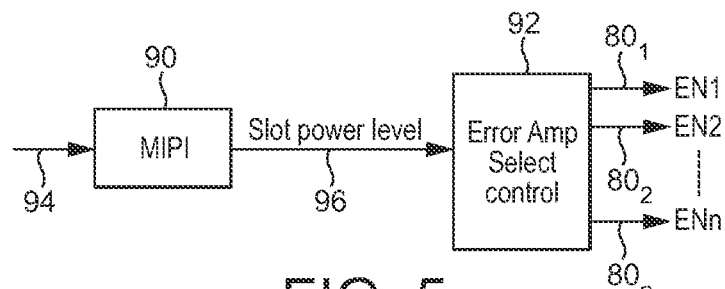
FIG. 5 illustrates an exemplary implementation of the generation of a control signal for an envelope tracked power amplifier system in accordance with the present invention.

As mentioned above the enable signals for the linear amplifiers may be provided by an appropriate control interface, and various techniques may be provided for generating the enable signals. FIG. 5 illustrates an exemplary preferred technique for generation of the enable signals.

In accordance with FIG. 5, the control interface for generating the enable signals is illustrated as a MIPI RFFE control interface. MIPI refers to the mobile industry processor interface, and RFFE refers to the radio frequency front end. A signal 94 is provided as an input to the MIPI 90, the signal on line 94 being a bus which is provided in the system, and not provided specifically for this invention. The MIPI 90 provides a slot power level to an error amplifier select/control block 92. The slot power level is a signal which is derivable from information in the MIPI, and is not provided specifically for this invention. The error amplifier select/control block 92 sets one of the enable signals $80_1$ to $80_n$. Preferably, therefore, the invention uses power information available in order to allow for selection of the appropriate enable signal.

Figure 6:
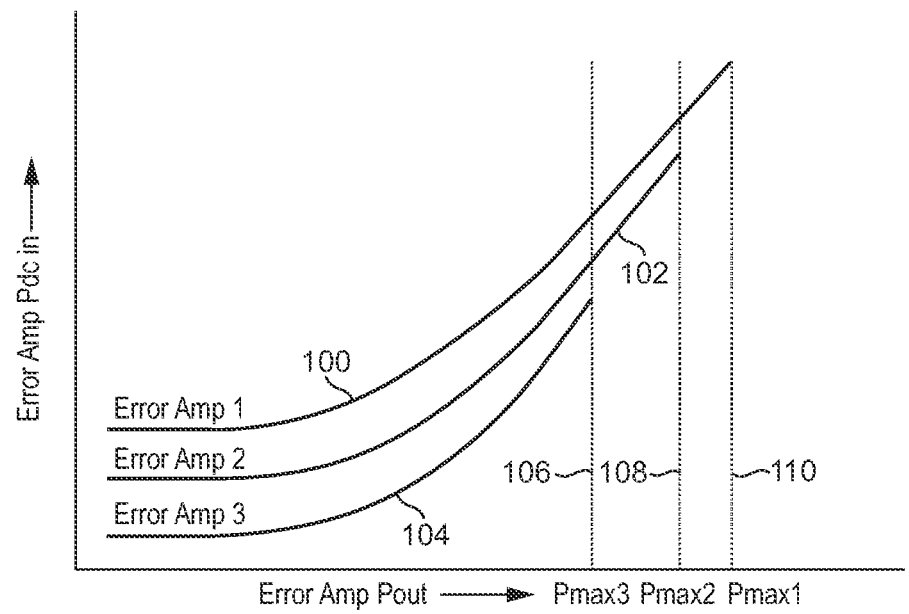
FIG. 6 illustrates a plot for the error amplifier in an improvement in accordance with the present invention.

With reference to FIG. 6, there is illustrated the performance of the three exemplary error amplifiers of FIG. 4 in a plot of the error amplifier DC input power against the error amplifier output power. Shown in FIG. 6 is a plot 100, 102, 104 for each of the error amplifiers $78_1$, $78_2$ and $78_n$.

Also illustrated in FIG. 6 are three vertical lines 106, 108 and 110 showing the maximum error amplifier output power for each of the error amplifiers. The maximum error amplifier output power "Pmax3" corresponds to error amplifier $78_3$; the maximum error amplifier output power "Pmax2" corresponds to error amplifier $78_2$, and the maximum error amplifier output power "Pmax1" corresponds to error amplifier $78_1$.

FIG. 6 illustrates the static dissipation for each error amplifier, and shows the static dissipation of error amplifier $78_1$ being greater than that of error amplifier $78_2$, which in turn is greater than that of error amplifier $78_3$. The static dissipation is the DC power, PDC, for an amplifier for a low output power, $P_{OUT}$. Thus the static dissipation is reduced for an error amplifier having a reduced maximum output power.

Figure 2:
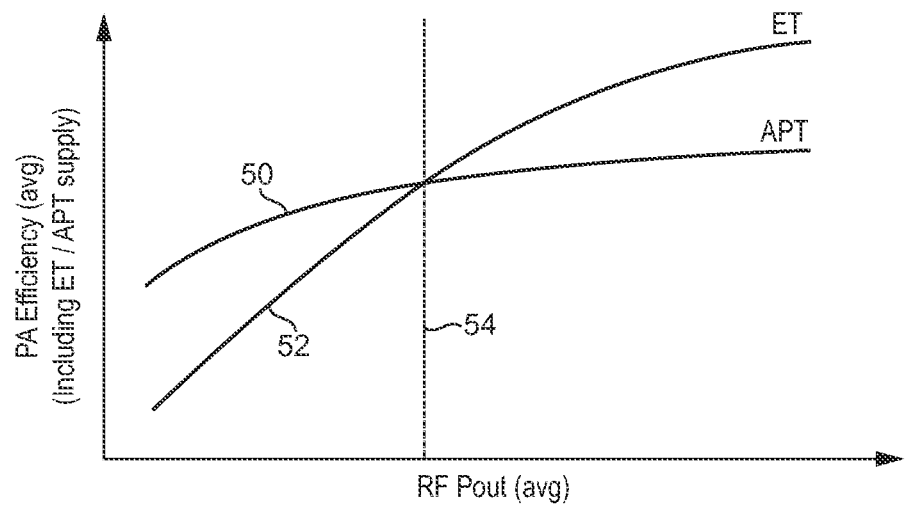
FIG. 2 illustrates the average power amplifier efficiency for an exemplary envelope tracked power amplifier system using a hybrid modulator encompassing an APT converter and an ET converter.

The efficiency of the envelope amplifier/power amplifier combination of reduced output power is improved over that possible with a single error amplifier dimension for maximum output power as illustrated in FIG. 2. This improvement is further illustrated with reference to FIG. 7.

Figure 7:
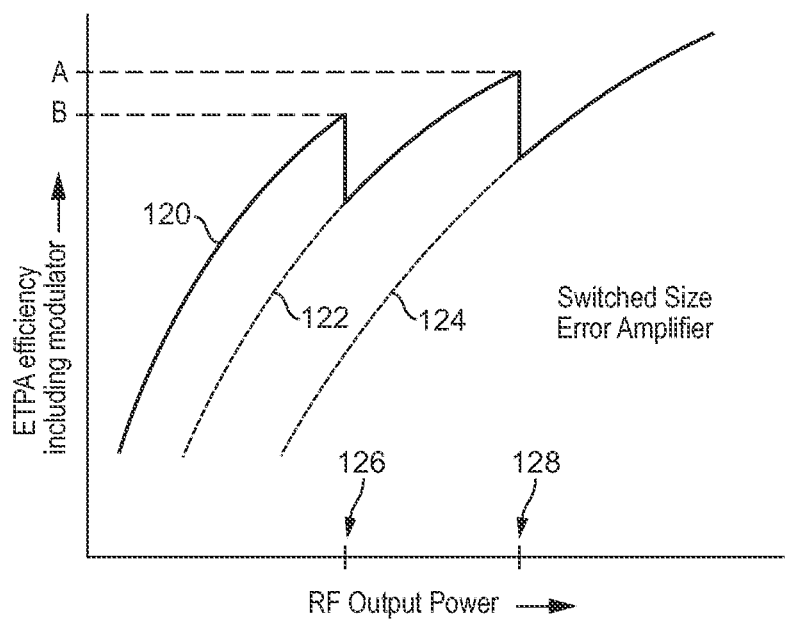
FIG. 7 illustrates an improvement provided by the arrangement of FIG. 4.

FIG. 7 shows a plot of envelope tracking power amplifier (ETPA) efficiency including the modulator against radio frequency (RF) output power for the switched size error amplifiers in accordance with the FIG. 4 modulator arrangement.

As shown in FIG. 7, the resulting efficiency is provided by the solid-line plot 120. The dash-line plots 124 and 122 illustrate the efficiency of the ETPA which would be achieved with single size error amplifiers corresponding to "error amp 1" and "error amp 2" of FIG. 6 respectively.

Further back-of efficiency improvements may be made by switching the power amplifier size at the same time as switching the error amplifier size. Thus there may be provided a plurality of (RF) power amplifiers in addition to the plurality of error amplifiers. Each error amplifier or combination of error amplifiers may be associated with a particular sized power amplifier or combination of power amplifiers. There may be a one-to-one mapping between error amplifiers and power amplifiers or the selection of error amplifiers may be independent of the selection of power amplifiers.

Figure 8:
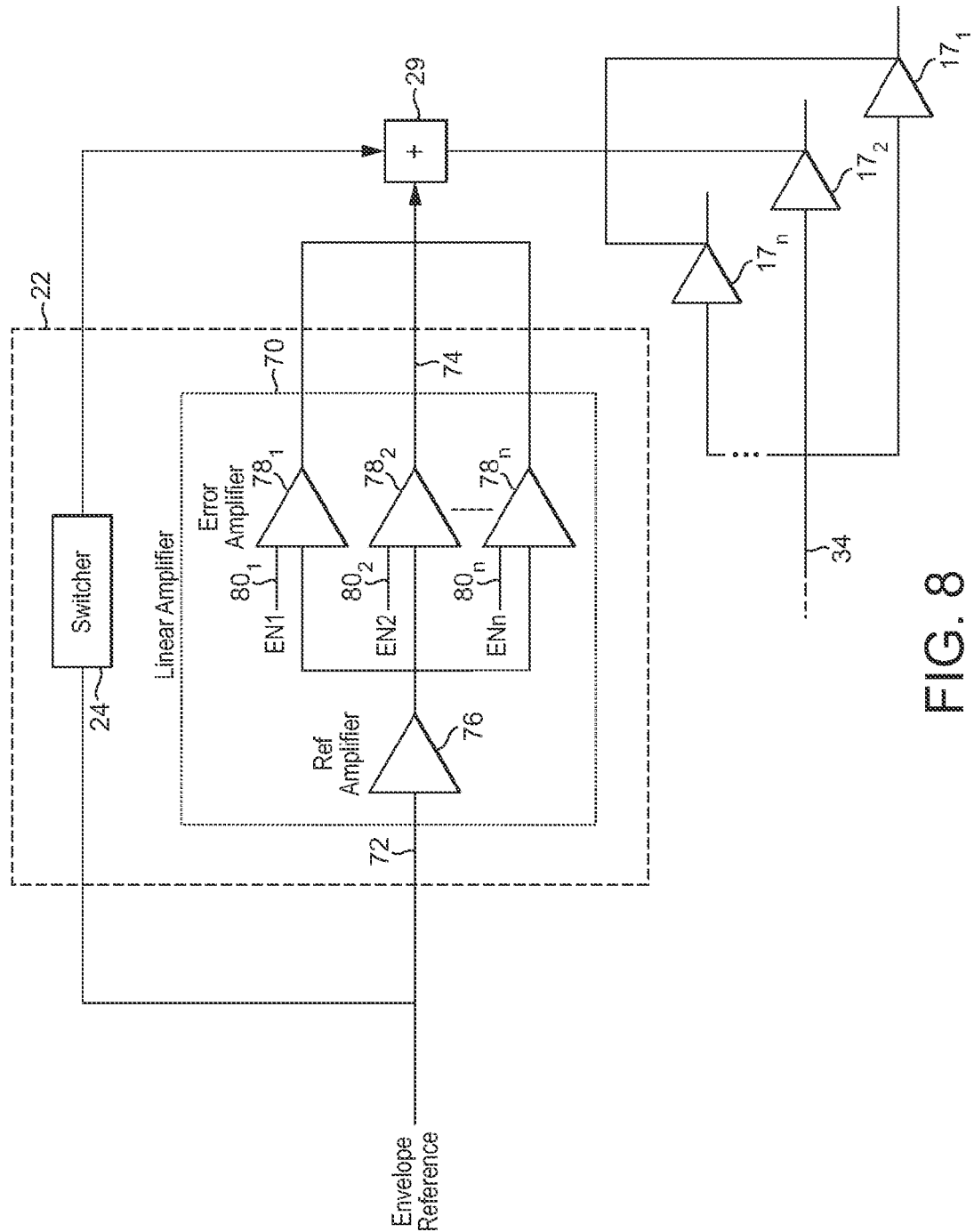
FIG. 8 illustrates an exemplary implementation of an error amplifier and power amplifier in accordance with an improvement.

With reference to FIG. 8 there is illustrated an arrangement in which there is provided a plurality of power amplifiers and a plurality of error amplifiers. In FIG. 8 reference numerals are used to refer to elements which correspond to elements of FIG. 4.

As shown in FIG. 8, there is illustrated the linear amplifier 70 corresponding to the linear amplifier of FIG. 4, which receives an envelope reference signal on line 72. In the arrangement of FIG. 8 the outputs of the error amplifiers $78_1$, $78_2$ and $78_n$ are selected or combined, and the selected or combined output is provided to a combiner 29.

In addition FIG. 8 illustrates the low-frequency path in the supply modulator comprising the switcher 24 which additionally receives the envelope reference signal on line 72, and generates an output. The output of the switcher 24 forms a second input to the summer 29.

The summer 29 provides an output which supplies a supply voltage for a respective (RF) power amplifier $17_1$, $17_2$ and $17_n$ of decreasing size. The sizes of the power amplifiers $17_1$, $17_2$ and $17_n$ are matched to the sizes of the error amplifiers $78_1$, $78_2$, and $78_n$ respectively, so that each error amplifier has just sufficient power to drive its corresponding RF power amplifier at its maximum output power.

Whilst in the arrangement of FIG. 8 there is shown a single combining for combining the outputs of the error amplifiers, which then provides a single combined (or summed) voltage to all the power amplifiers, there may be one or more combiners combining one or more error amplifiers with the switch supply to provide one or more power supplies to one or more power amplifiers.

In the example of FIG. 8, each of the RF amplifiers $17_1$, $17_2$ and $17_n$ receives a common RF input signal on line 34, and generates an RF output signal at its output. In practice each power amplifier may receive a dedicated input signal rather than a common input signal, and the output of the power amplifiers may be combined or maybe processed individually.

Figure 9:
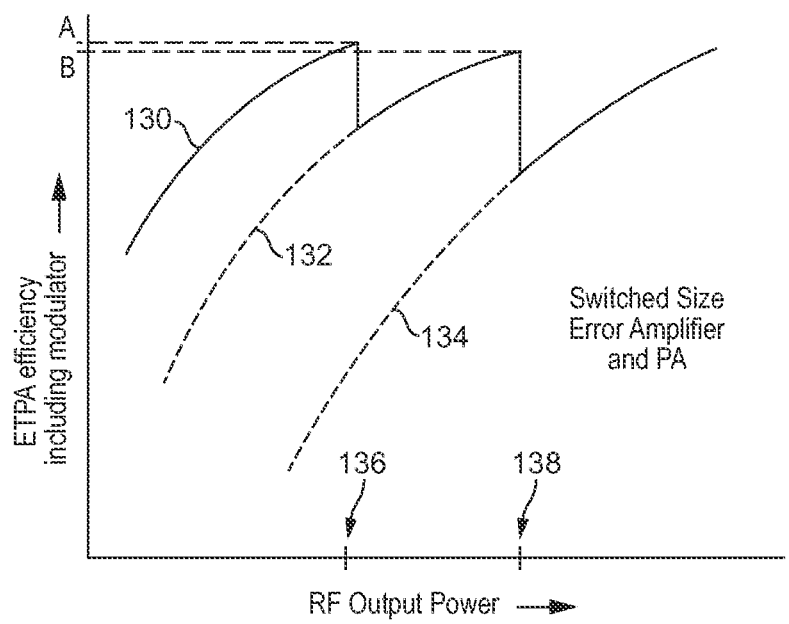
FIG. 9 illustrates an improvement provided by the arrangement of FIG. 8.

The improvement provided by the arrangement of FIG. 8 is further illustrated with reference to FIG. 9. FIG. 9 corresponds to FIG. 7 but illustrates a plot of ETPA efficiency including the modulator against RF output power for the arrangement of FIG. 8.

In FIG. 9 the plot 130 illustrates the improved efficiency provided by the switched error amplifier and power amplifier arrangement of FIG. 8. The dash-line plots 134 and 132 illustrate the plots of the efficiency which would be achieved with single size error amplifiers corresponding to error amplifier $78_1$ and power amplifier $17_1$, and error amplifier $78_2$ and error amplifier $17_2$ respectively.

If only the error amplifier is switched, in accordance with the arrangement described herein with reference to FIG. 4, the envelope tracking swing range diminishes with reducing power resulting in lower efficiency at the output powers at switching occurs, as represented by the efficiencies A and B as shown in FIG. 7, compared with the corresponding points of FIG. 9 in which the power amplifier size is also switched.

If the power amplifier size is also switched, in accordance with the arrangement described herein with reference to FIG. 8, as illustrated by FIG. 9 the full envelope tracking swing range (and hence envelope tracking efficiency enhancement) is restored when operating at the maximum operating power of the selected error amplifier and power amplifier combination.

In the preferred arrangement one error amplifier amongst the plurality of error amplifiers is enabled, the other error amplifiers being disabled. Further in the preferred arrangement, the corresponding size power amplifier amongst the plurality of power amplifiers is enabled, the other power amplifiers being disabled.

The invention has been described herein by way of reference to a particular example of a supply modulator for a cellular telephone handset which has both an APT mode and an ET mode of operation. One skilled in the art will appreciate that the present invention is not limited to such an example implementation, and the invention may be applied in other applications.

The scope of the invention is defined by the appended claims.

The invention claimed is:

1. An envelope tracking supply modulator, comprising:
a switch mode path; and
a linear amplifier path, wherein the linear amplifier path includes a plurality of linear amplifiers, each linear amplifier having an output stage of a different size, wherein at least one of the plurality of linear amplifiers is enabled in dependence on an output power, and wherein each of the plurality of linear amplifiers is configured to be enabled based on a separate control signal.

2. The envelope tracking supply modulator of claim 1, wherein the output power comprises an average power measured across a transmission slot.

3. The envelope tracking supply modulator of claim 1, wherein outputs of the plurality of linear amplifiers are combined with an output of the switch mode path to provide a modulated supply voltage.

4. The envelope tracking supply modulator of claim 3, wherein the modulated supply voltage comprises a supply voltage for an amplifier.

5. The envelope tracking supply modulator of claim 4, wherein the amplifier includes a plurality of amplifiers, each configured to receive the modulated supply voltage.

6. The envelope tracking supply modulator of claim 5, wherein the plurality of amplifiers have different sizes, each amplifier being associated with one of the plurality of linear amplifiers.

7. The envelope tracking supply modulator of claim 6, wherein at least one of the plurality of amplifiers is selectively enabled.

8. The envelope tracking supply modulator of claim 7, wherein the at least one of the plurality of amplifiers is selectively enabled based on the at least one of the plurality of linear amplifiers which is enabled.

9. The envelope tracking supply modulator of claim 8, wherein each amplifier configured to receive the modulated supply voltage is paired with an amplifier of the plurality of linear amplifiers, such that a pair is enabled in dependence on the output power.

10. The envelope tracking supply modulator of claim 1, wherein the output power is determined for a transmission slot.

11. The envelope tracking supply modulator of claim 1, wherein the plurality of linear amplifiers are arranged for correcting an error in the switch mode path.

12. A method of generating an envelope tracking modulated supply signal, comprising:
generating a first power supply signal via a switch mode power supply;
generating a second power supply signal via at least one of a plurality of linear amplifiers, wherein each of the plurality of linear amplifiers has a different size, and wherein generating the second power supply signal comprises enabling at least one of the plurality of linear amplifiers in dependence on an output power, and wherein each of the plurality of linear amplifiers is configured to be enabled based on a separate control signal.

13. The method of claim 12, wherein the output power comprises an average power measured across a transmission slot.

14. The method of claim 12, further comprising determining the output power for a transmission slot.

15. The method of claim 12, further comprising combining the outputs of the plurality of linear amplifiers with an output of the switch mode power supply to generate a modulated supply voltage.

16. The method of claim 15, wherein the modulated supply voltage is provided to a plurality of amplifiers having different sizes.

17. The method of claim 16, further comprising selectively enabling at least one of the plurality of amplifiers.

18. The method of claim 17, wherein the at least one of the plurality of amplifiers are selectively enabled in dependence on the at least one of the plurality of linear amplifiers which are enabled.

\* \* \* \* \*